(12) United States Patent
Peddada et al.

(10) Patent No.: US 11,189,750 B2
(45) Date of Patent: *Nov. 30, 2021

(54) SEPARATING A WAFER OF LIGHT EMITTING DEVICES

(71) Applicant: Lumileds LLC, San Jose, CA (US)

(72) Inventors: Rao S. Peddada, San Jose, CA (US); Frank Lili Wei, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/268,191

(22) Filed: Feb. 5, 2019

(65) Prior Publication Data

US 2019/0305176 A1    Oct. 3, 2019

Related U.S. Application Data

(63) Continuation of application No. 15/664,825, filed on Jul. 31, 2017, now Pat. No. 10,205,050, which is a (Continued)

(51) Int. Cl.
*H01L 33/00* (2010.01)
*B28D 5/00* (2006.01)
*H01S 5/02* (2006.01)

(52) U.S. Cl.
CPC ........ *H01L 33/0095* (2013.01); *B28D 5/0011* (2013.01); *H01L 33/007* (2013.01); *H01S 5/0201* (2013.01)

(58) Field of Classification Search
CPC . H01S 5/0201; B28D 5/0011; Y10T 83/0524; B23K 26/53
See application file for complete search history.

(56) References Cited

U.S. PATENT DOCUMENTS 4,237,601 A    12/1980  Woolhouse et al.
8,062,959 B2   11/2011  Sakamoto et al.
(Continued)

FOREIGN PATENT DOCUMENTS

CN    101221998      7/2008
CN    102049815 A    5/2011
(Continued)

OTHER PUBLICATIONS

EPO as ISA, International Search Report and Written Opinion, dated Feb. 6, 2015, from International Application No. PCT/IB2014/065487, filed Oct. 21, 2014, 10 pages.
(Continued)

*Primary Examiner* — Alia Sabur
(74) *Attorney, Agent, or Firm* — Volpe Koenig

(57) ABSTRACT

A method of separating a wafer including rows of light emitting devices is described. Dicing streets are provided on the wafer such that a respective one of the dicing streets is provided between each of the rows of light emitting devices on the wafer. The wafer is broken along a first one of the dicing streets to separate a first portion of the wafer from a remaining portion of the wafer. The first portion of the wafer includes more than one of the rows of light emitting devices. The first portion of the wafer is broken along a second one of the dicing streets to separate a second portion of the wafer from the first portion of the wafer.

15 Claims, 7 Drawing Sheets

Related U.S. Application Data continuation of application No. 15/031,612, filed as application No. PCT/IB2014/065487 on Oct. 21, 2014, now Pat. No. 9,722,138.

(60) Provisional application No. 61/896,836, filed on Oct. 29, 2013.

(56) References Cited

U.S. PATENT DOCUMENTS

| | | |
|---|---|---|
| 8,399,281 B1 | 3/2013 | Patterson et al. |
| 10,205,050 B2 * | 2/2019 | Peddada ............... H01L 33/007 |
| 2001/0028062 A1 | 10/2001 | Uemura et al. |
| 2003/0121511 A1 | 7/2003 | Hashimura et al. |
| 2005/0263854 A1 | 12/2005 | Shelton et al. |
| 2008/0121906 A1 | 5/2008 | Yakushiji |
| 2008/0194080 A1 | 8/2008 | Cheng et al. |
| 2009/0315174 A1 | 12/2009 | Co et al. |
| 2011/0128980 A1 * | 6/2011 | Kato .................. H01L 33/0095 372/43.01 |
| 2011/0132885 A1 | 6/2011 | Sercel et al. |
| 2011/0183453 A1 | 7/2011 | Hironaka et al. |
| 2011/0309373 A1 * | 12/2011 | Sharma ............... H01L 33/0095 257/76 |
| 2013/0178006 A1 | 7/2013 | Kim et al. |
| 2013/0192435 A1 * | 8/2013 | Jarry .................... H01L 21/463 83/19 |

FOREIGN PATENT DOCUMENTS

| | | |
|---|---|---|
| CN | 102653115 A | 9/2012 |
| JP | S60-167351 | 8/1985 |
| JP | 07-211671 | 8/1995 |
| JP | 2001-284291 A | 10/2001 |
| JP | 2001-284491 | 10/2001 |
| JP | 2011-096941 | 5/2011 |
| JP | 5281544 B2 * | 9/2013 |
| KR | 101265203 | 5/2013 |
| KR | 101265203 B1 * | 5/2013 |

OTHER PUBLICATIONS

Porter D.A. and Berfield T. A. 2013 Die separation and rupture strength for deep reacive ion etched silicon wafers J. Micromech. Microeng. 23 085020.

Communication pursuant to Article 94(3) EPC dated Feb. 5, 2019 for European Patent Application No. 14 802 185.0.

* cited by examiner

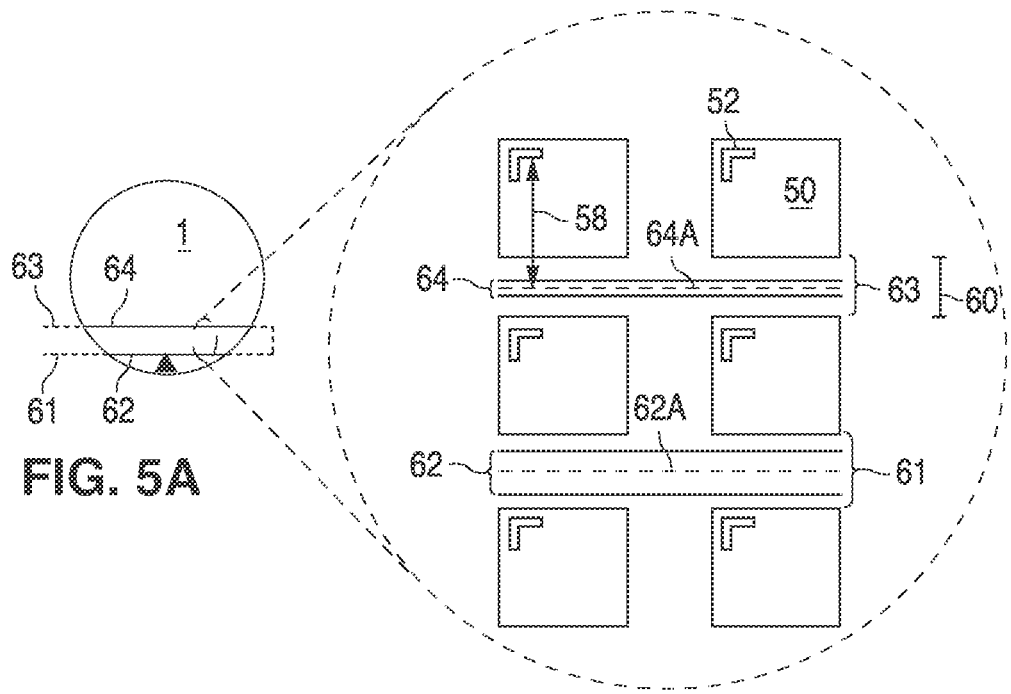
FIG. 5A
FIG. 5B
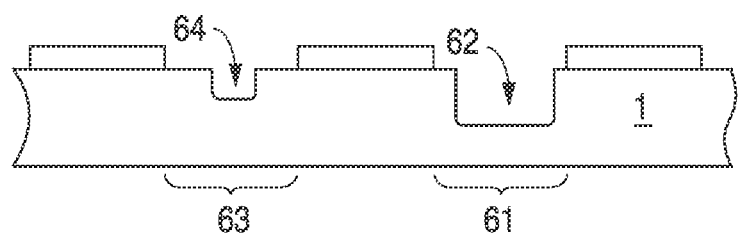
FIG. 5C

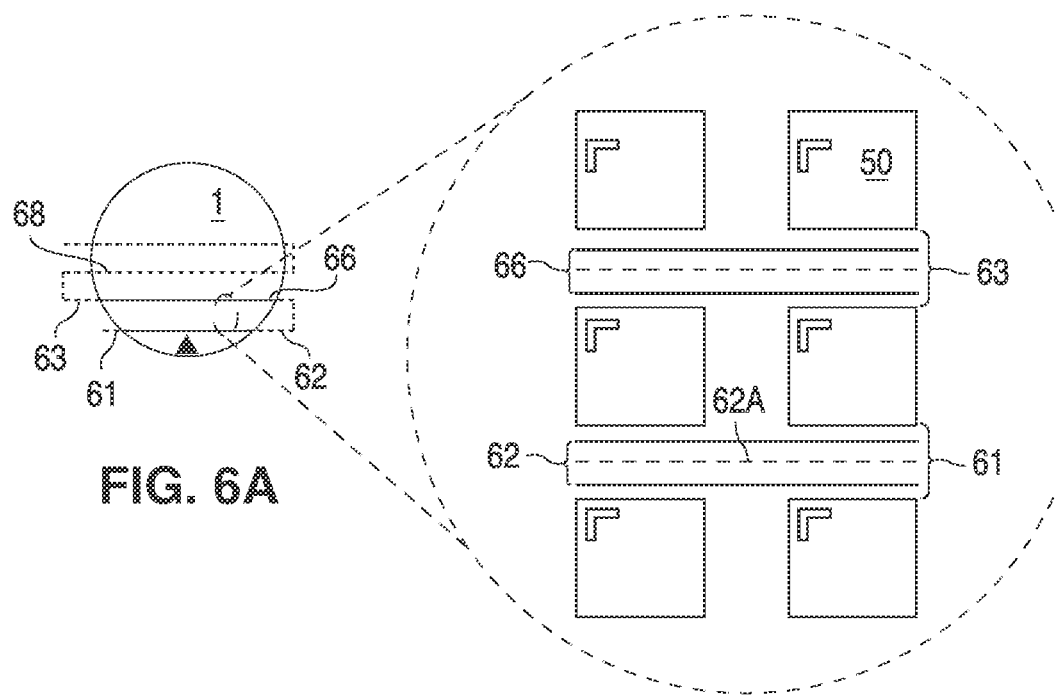
FIG. 6A
FIG. 6B
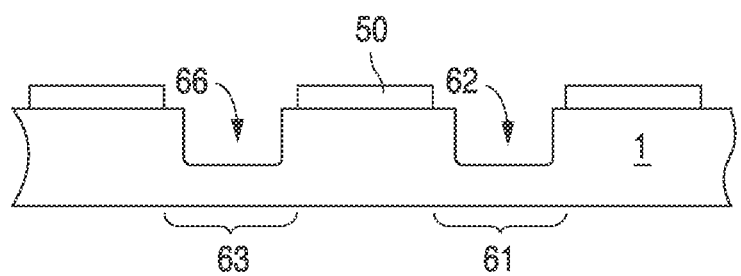
FIG. 6C

SEPARATING A WAFER OF LIGHT EMITTING DEVICES

CROSS REFERENCE TO RELATED APPLICATIONS

This application is a continuation of U.S. patent application Ser. No. 15/664,825, filed Jul. 31, 2017, which is a continuation of U.S. patent application Ser. No. 15/031,612, filed Apr. 22, 2016, which issued as U.S. Pat. No. 9,722,138 on Aug. 1, 2017, which is a § 371 application of International Application No. PCT/IB2014/065487 filed on Oct. 21, 2014, which claims the benefit of U.S. Provisional Application Ser. No. 61/896,836, filed Oct. 29, 2013, which are incorporated by reference as if fully set forth.

FIELD OF INVENTION

The present invention relates to methods of separating a wafer of light emitting devices into individual light emitting devices or groups of light emitting devices.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III V semiconductors, particularly binary, ternary, and quaternary alloys of gallium, aluminum, indium, and nitrogen, also referred to as III nitride materials. Typically, III nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

US 2011/0132885 describes singulating a wafer of semiconductor devices. Paragraph 4 teaches "a laser is often used in the process of dicing a semiconductor wafer such that individual devices (or dies) manufactured from the semiconductor wafer are separated from each other. The dies on the wafer are separated by streets and the laser may be used to cut the wafer along the streets. A laser may be used to cut all the way through the wafer, or part way through the wafer with the remaining portion of the wafer separated by breaking the wafer at the point of perforation. When manufacturing light emitting diodes (LEDs), the individual dies on the wafer correspond to the LEDs."

SUMMARY

It is an object of the invention to provide methods of dicing a wafer of LEDs that may improve yields.

Embodiments of the invention are directed to a method of separating a wafer of light emitting devices. The method includes scribing a first groove on a dicing street on the wafer and checking the alignment of the wafer using a location of the first groove relative to a feature on the wafer. After checking the alignment, a second groove is scribed on the dicing street.

Embodiments of the invention are directed to a method of separating a wafer of light emitting devices. The wafer includes a plurality of light emitting devices disposed in a plurality of rows separated by streets. The method includes breaking the wafer along a street to separate a section from a remaining portion of the wafer. The section and the remaining portion of the wafer each include at least two rows of light emitting devices. The method further includes breaking the section along a street disposed between the at least two rows of light emitting devices.

BRIEF DESCRIPTION OF THE DRAWINGS

FIG. 5A is a plan view of a wafer including a street scribed with a singulation groove and a street scribed with a pilot groove.

FIG. 5B is a plan view of a portion of the wafer of 5A, illustrated in more detail.

FIG. 5C is a cross sectional view of the wafer illustrated in FIG. 5A.

FIG. 6A is a plan view of the wafer of FIG. 5A after scribing a singulation groove over the pilot groove and after scribing additional singulation grooves.

FIG. 6B is a plan view of a portion of the wafer of 6A, illustrated in more detail.

FIG. 6C is a cross sectional view of the wafer illustrated in FIG. 6A.

DETAILED DESCRIPTION OF THE PREFERRED EMBODIMENTS

Though in the examples below the semiconductor light emitting devices are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
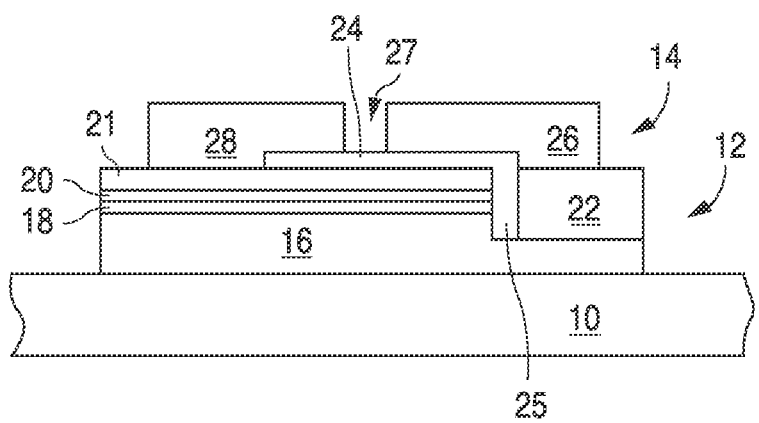
FIG. 1 illustrates one example of a III-nitride LED.

FIG. 1 illustrates a III-nitride LED that may be used in embodiments of the present invention. Any suitable semiconductor light emitting device may be used and embodiments of the invention are not limited to the device illustrated in FIG. 1. The device of FIG. 1 is formed by growing a III-nitride semiconductor structure 12 on a growth substrate 10 as is known in the art. The growth substrate is often sapphire but may be any suitable substrate such as, for example, SiC, Si, GaN, or a composite substrate. The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric 24 such as an oxide of silicon or any other suitable material. Multiple re-contact vias may be formed; the n- and p-contacts 22 and 21 are not limited to the arrangement illustrated in FIG. 1. The n- and p-contacts may be redistributed to form bond pads with a dielectric/metal stack, as is known in the art.

In order to form electrical connections to the LED, one or more interconnects 26 and 28 are formed on or electrically connected to the n- and p-contacts 22 and 21. Interconnect 26 is electrically connected to n-contact 22 in FIG. 1. Interconnect 28 is electrically connected to p-contact 21. Interconnects 26 and 28 are electrically isolated from the n- and p-contacts 22 and 21 and from each other by dielectric 24 and gap 27. Interconnects 26 and 28 may be, for example, solder, stud bumps, gold layers, or any other suitable structure. Many individual LEDs are formed on a single wafer then diced from a wafer of devices, as described below. The interconnects 26 and 28 are represented in the following figures by block 14. The semiconductor structure and the n- and p-contacts 22 and 21 are represented in the following figures by block 12.

Though the embodiments below describe separating a wafer into individual LEDs, the techniques described may be used to separate a wafer into groups of LEDs. Though the embodiments below refer to a sapphire growth substrate, the techniques described may be applied to any suitable growth substrate.

Figure 2:
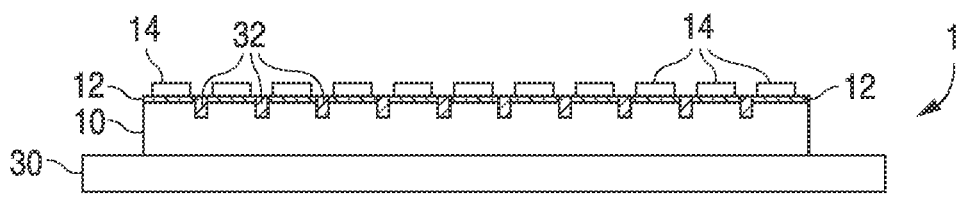
FIG. 2 illustrates a portion of a wafer of LEDs formed on a substrate.
Figure 3:
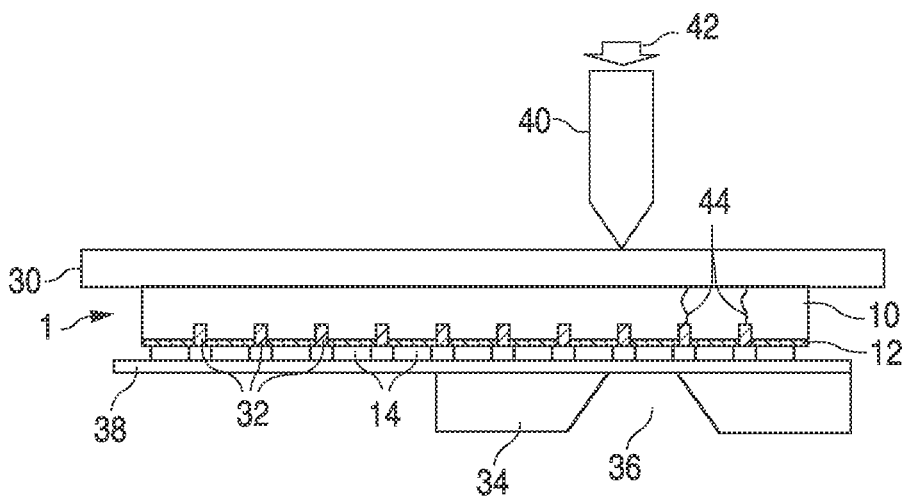
FIG. 3 illustrates scribing and breaking a wafer of LEDs into individual LEDs.

FIGS. 2 and 3 illustrate scribing and breaking a wafer to separate individual LEDs. In FIG. 2, a wafer 1 is attached to a dicing frame 30 such that the interconnects 14 are facing up. The wafer is laser scribed by guiding a laser beam along dicing streets 32 between LEDs. Laser scribing creates grooves in the semiconductor structure 12 and a portion of the thickness of the substrate 10. The grooves in semiconductor structure 12 delineates structure 12 into multiple devices.

In FIG. 3, the wafer is broken along the scribed grooves formed in FIG. 2. The wafer is placed on a support 34 with the interconnects facing down, toward the support 34. A wafer cover 38 may be disposed between the wafer 1 and the support 34, to protect the interconnects 14 and semiconductor structure 12 during breaking. The wafer is then subjected to a Guillotine-like die break setup, where a force 42 is applied to a blade 40 which is placed on the dicing frame 30, aligned with the laser-scribed grooves 32. The blade 40 is aligned with a gap 36 in the wafer support 34. The force 42 on blade 40 causes fracture propagation 44 from the laser scribed grooves 32 through the remaining thickness of the wafer 1, resulting in separation.

Figure 4:
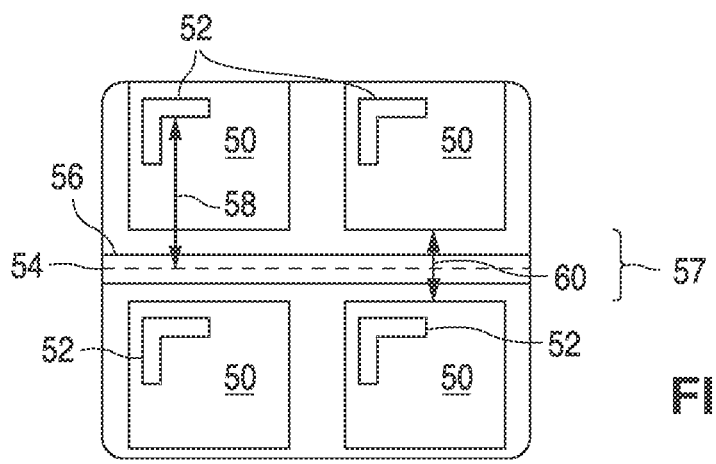
FIG. 4 is a plan view of a portion of a wafer including a laser-scribed kerf disposed between two groups of two LEDs.

Laser scribing as illustrated in FIG. 2 can change the stress states of the wafer and heat up machine components, which may cause the wafer to become misaligned. Accordingly, corrections to the location where the groove is scribed must be made periodically during laser scribing of a wafer, to avoid damaging the LEDs on the wafer. Checking the position where the groove is scribed is typically an automated process where the center of the laser scribing position is matched to the center of the area between neighboring rows of LEDs (also referred to herein as dicing streets), using image processing algorithms and fiducial targets formed on the wafer, as illustrated in FIG. 4. A fiducial target is a reference mark formed on the wafer.

FIG. 4 illustrates four LEDs 50 with fiducial targets 52 formed on each LED. A scribed groove 56 runs between two sets of two LEDs 50 each. The center of the scribed groove 56 is indicated by dashed line 54. The scribed groove 56 is located preferably at the center of dicing street 57. To check the position of the groove 56 (also referred to herein as a kerf position check), an image is captured (for example, an image of the four LEDs 50 illustrated in FIG. 4) and its pixels are analyzed in grey scale. Sharp contrasts in color scale around the scribe line generate the signal needed for the machine to extrapolate the center 54 of the groove 56 by defining the groove boundaries. Lighting conditions are optimized to create mostly black pixels inside the scribed groove 56 and light-colored pixels outside the scribed groove 56. The locations of fiducials 52 are programmed into the machine before the wafer is loaded. The kerf position is adjusted by the machine by finding the previously programmed fiducial mark 52 in the captured image, then adjusting the wafer position to match one or more known fixed distances such as, for example, the distance 58 from the fiducial 52 to the center 54 of the scribed groove 56, or the distance 60 between two LEDs 50 as illustrated in FIG. 4.

A thicker growth substrate 10 requires a deeper laser-scribed groove depth as compared to a thinner wafer. For example, a sapphire growth substrate that is greater than 200 microns thick (for example, between 230 and 250 microns thick) may require a groove depth of at least 50 microns and no more than 60 microns, while a sapphire substrate between 100 and 120 microns thick may require a groove depth of only 30 to 35 microns. The depth of the scribed groove may be made deeper by increasing the pulse peak power of the laser scribe. The deeper the groove depth, the wider the surface opening of the scribed groove; i.e., the top of the kerf is wider for a deeper groove than for a shallower groove.

Conventional image processing algorithms may not recognize the wider grooves caused by deeper scribing. After scribing of grooves 50 to 60 microns deep, shiny slag may be observed in the grooves. The laser scribe machine vision software may interpret the shiny slag as white pixels. These white pixels inside the scribed lines may prevent the image algorithm from recognizing the boundaries of the grooves.

In embodiments of the invention, a shallow pilot groove that is used for scribe line or kerf position detection is formed first. After detection and correction of the position of the wafer, a deep groove is scribed that is used for wafer singulation.

FIGS. 5 and 6 illustrate scribing a shallow pilot groove and a deep singulation groove. FIGS. 5A, 5B, and 5C illustrate forming a shallow pilot groove for kerf position correction. FIGS. 6A, 6B, and 6C illustrate forming a deep singulation groove after kerf position correction. FIGS. 5A and 6A are top views of a wafer. FIGS. 5B and 6B illustrate portions of the wafers illustrated in FIGS. 5A and 6A, respectively, in more detail. FIGS. 5C and 6C are side views of the wafers illustrated in FIGS. 5A and 6A, respectively.

On the wafer illustrated in FIGS. 5A, 5B, and 5C, street 61 is scribed before street 63. Street 61 is scribed with a deep singulation groove 62, the center of which is indicated at 62A. Street 63 is scribed with a shallow pilot groove 64 used for kerf position detection and correction. The center of pilot groove 64 is indicated at 64A. The pilot groove 64 in street 63 is shallower than the singulation groove 62 in street 61, as illustrated in FIG. 5C.

The pilot groove 64 may be no more than 15% of the depth of the singulation groove 62 in some embodiments, no more than 20% of the depth of the singulation groove in some embodiments, and no more than 30% of the depth of the singulation groove in some embodiments. In one example, the pilot groove has a depth of 10 μm and the singulation groove 62 has a depth of 60 μm.

The pilot groove 64 may be narrower than the singulation groove 62, as illustrated in FIG. 5B. The pilot groove 64 may be no more than 50% of the width of the singulation groove 62 in some embodiments, no more than 60% of the width of the singulation groove 62 in some embodiments, and no more than 70% of the width of the singulation groove 62 in some embodiments. In one example, the pilot groove 64 has a width of 14 μm and the singulation groove has a width of 26 μm. In one example, the pilot groove 64 scribed in street 63 may be formed at less than 10% of the process power of a laser scribe, while the singulation groove 62 scribed in street 61 may be formed at 100% of the process power of the laser scribe. The pilot groove 64 scribed in street 63 is recognizable as a groove by a kerf position detection algorithm performed by a machine, while the singulation groove 62 scribed in street 61 is not recognizable as a groove.

After the pilot groove 64 in street 63 is scribed in FIGS. 5A, 5B, and 5C, kerf position correction is undertaken, for example by detecting fiducials 52 and determining distances 58 and 60, as described above, followed by moving the wafer to realign the wafer according to predetermined values for the distances 58 and/or 60.

In FIGS. 6A, 6B, and 6C, street 63 is scribed again with a singulation groove 66. The singulation groove 66 destroys the earlier-formed pilot groove 64. The singulation groove 66 may be formed at 100% of the process power of the laser scribe. The following streets, beginning with street 68, are then scribed with singulation grooves, until the next kerf detection and correction street is reached. The process of forming the low- and high-power pilot and singulation grooves described above is repeated at each remaining kerf detection and correction location. The kerf detection and correction process described above may use standard laser scribing equipment and may be fully automated.

After the entire wafer is laser scribed, individual LEDs or groups of LEDs may be singulated by breaking, as described above and in more detail below.

Prior to wafer separation, also called dicing, a dicing frame 30 is attached to the wafer 1. Dicing frame 30 may be a stretchable dicing tape. As described above a wafer cover 38 may be disposed between the wafer 1 and the support 34, to protect the interconnects 14 and semiconductor structure 12 during the breaking process.

Figure 7:
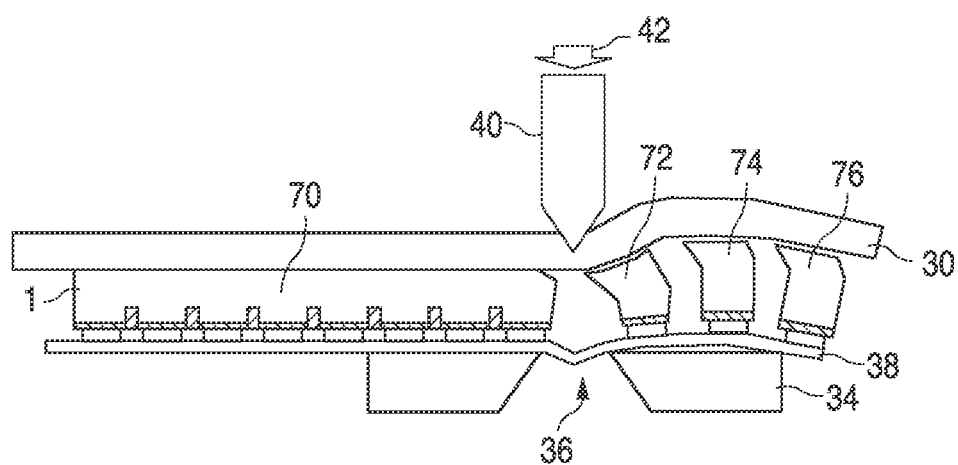
FIG. 7 illustrates sidewall offsets caused by breaking a wafer.

Wafers are typically separated into individual LEDs or groups of LEDs by applying force 42 to break the wafer 1. The groups of LEDs between breaks in the wafer may be one LED wide, or multiple LEDs wide. In the alternative groups, may consist of a single device or several devices in any suitable arrangement including square blocks of devices or L-shaped groups. Typically a wafer is separated sequentially row-by-row, one device wide, as illustrated in FIG. 7. After row separation, each row may be separated into individual devices or groups of devices. The wafer 1 is moved along support 34 and blade 40, which aligns with a gap 36 in support 34.

In FIG. 7, row 76 is separated from the wafer first by breaking the wafer between row 76 and row 74, then row 74 is separated from the wafer, then row 72, etc. After breaking, rows 72, 74, and 76 remain attached to dicing frame 30 and wafer cover separator 38. The wafer bodies on either side of the cutting blade 40 do not have equal bending moments, because one side (rows 76, 74, and 72) consists of already broken regions while the other side (remainder of wafer 70) consists of a partial wafer piece not yet broken. As a fracture develops during breaking, the asymmetry in bending moments may generate a bias in crack propagation leading to sidewall offsets, as illustrated in rows 72, 74, and 76. The sidewalls of devices in some rows may be slanted as a result of the unequal forces during the breaking process.

Furthermore, the dicing frame 30 and wafer cover separator 38 may stretch when the wafer is broken. Upon subsequent recovery of the dicing frame 30 and wafer cover separator 38 after breaking, the positions of the remaining wafer pieces and/or dies may slightly shift due to the movements of the dicing frame 30 and wafer cover separator 38. The movement that causes the shift in the positions of the remaining wafer pieces and/or dies may occur during breaking, or during recovery after breaking. As breaking progresses along a wafer, mis-alignment between dicing lanes and machine's axis may be introduced and may progressively worsen.

Figure 8:
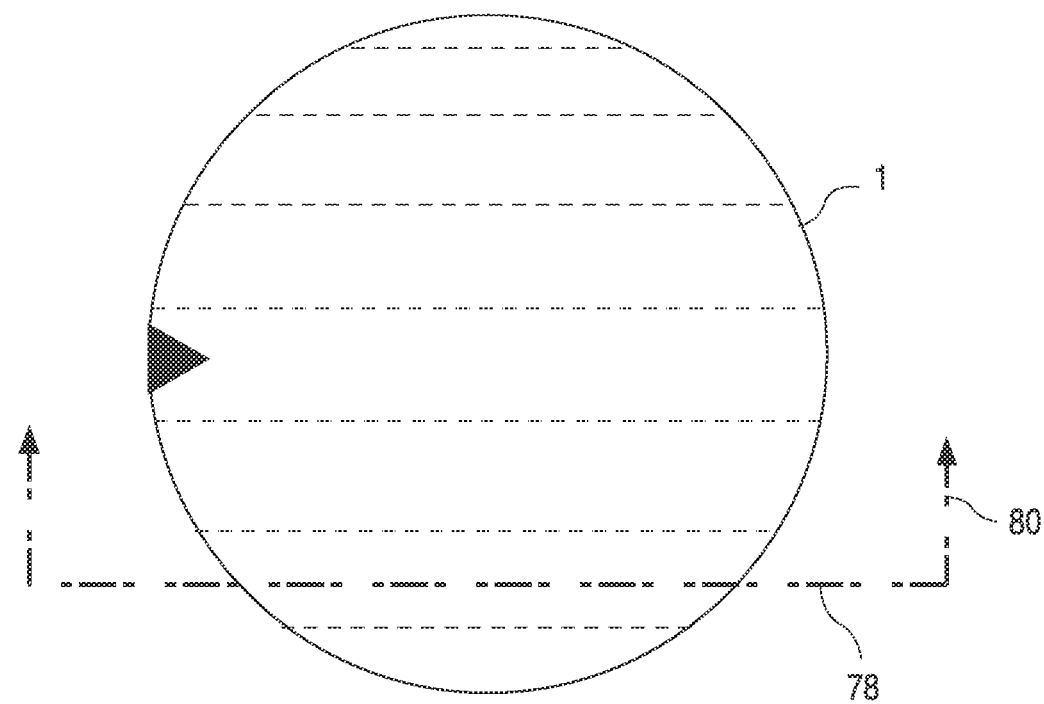
FIGS. 8 and 9 illustrate sequential line-by-line breaking of a wafer.
Figure 9:
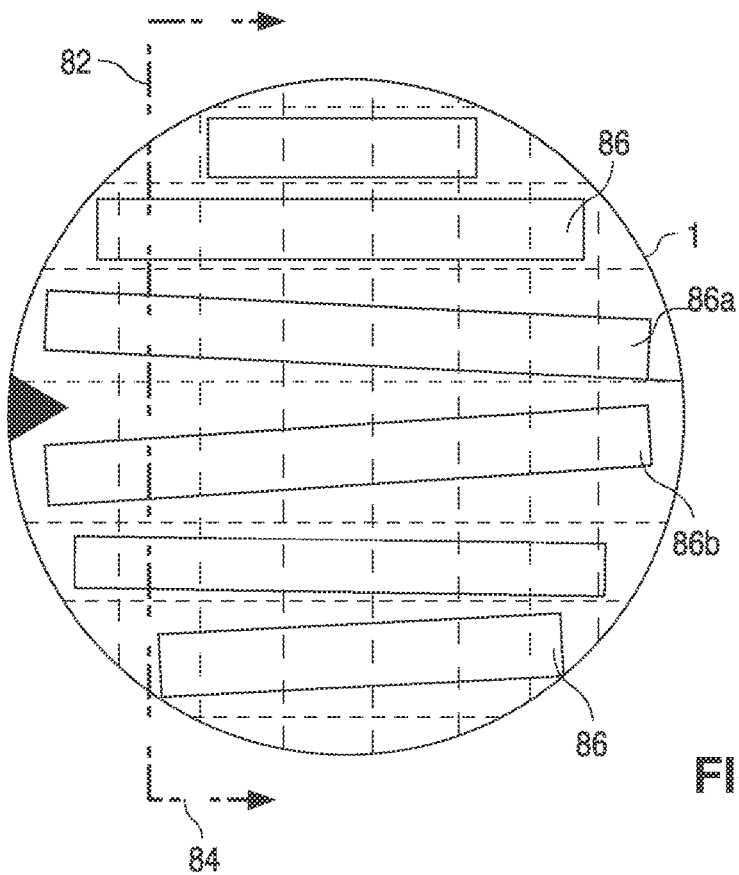

For example, FIGS. 8 and 9 illustrate sequential line-by-line breaking of a wafer 1. In FIG. 8, the blade 40 (shown in FIGS. 3 and 7) is aligned along axis 78 and advances along the wafer in direction 80, breaking the wafer sequentially at the dashed horizontal lines shown in the figure. (Though in the following figures the blade is described as moving or advancing, it is to be understood that only the relative movement of the blade and the wafer is relevant, such that either the blade or the wafer may move. Often the wafer moves while the blade remains in one place.)

In FIG. 9, the blade is aligned along axis 82 and advances in direction 84, breaking the wafer sequentially at the dashed vertical lines shown in the figure. The rows 86 (86 refers to all of the rows) that were broken in FIG. 8 may become misaligned due to stretching of tape frame 30 and wafer cover separator 38. For example, groups 86a and 86b are tilted relative to the horizontal dashed break lines. When the wafer is broken along the vertical dashed break lines, some of the device in groups 86a and 86b may be broken in the wrong place due to the misalignment, which can reduce yield.

Figure 10:
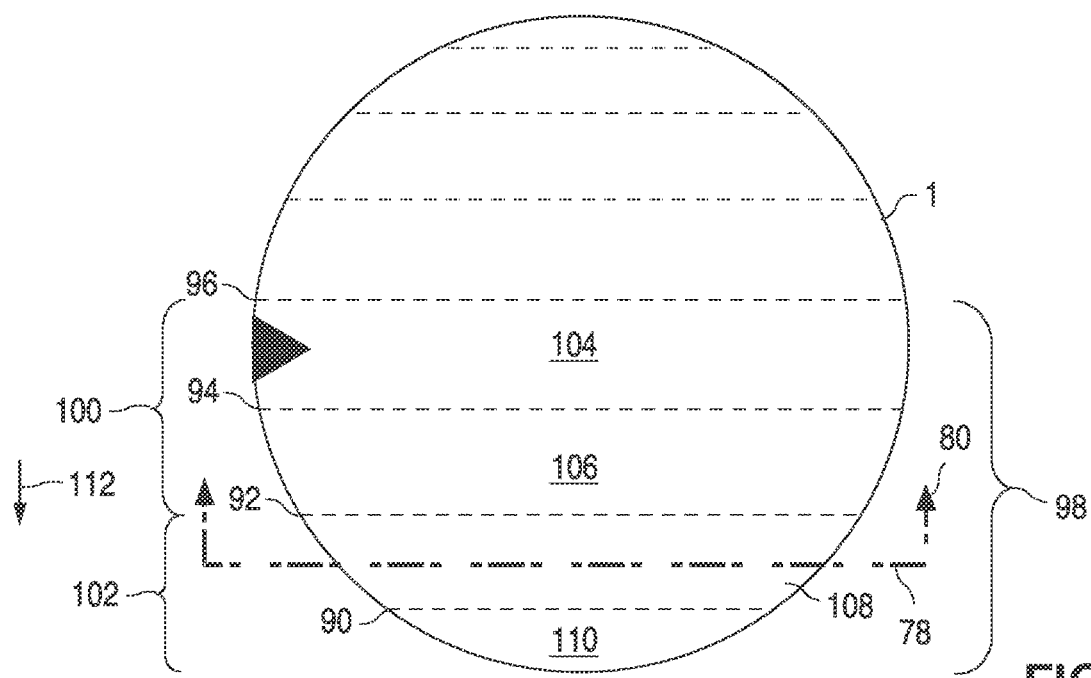
FIG. 10 illustrates non-sequential breaking of a wafer.

In embodiments of the invention, a wafer is broken non-sequentially, which may reduce sidewall offsets and may improve yield. FIG. 10 illustrates non-sequential breaking of a wafer. In FIG. 10, the wafer is broken first at street 96, to form a group 98 of four rows of LEDs. The wafer is then broken at street 92, to form two groups 100 and 102 of two rows of LEDs. The wafer is then broken at street 90, to form individual rows of LEDs 108 and 110. The wafer is then broken at street 94, to form individual rows of LEDs 104 and 106. Breaking the wafer first into a section including four rows of LEDs may reduce the difference in bending moment on either side of the blade (illustrated in FIG. 7), which may reduce sidewall offsets on the LEDs, and may reduce the misalignment illustrated in FIG. 9.

To break the wafer in the pattern illustrated in FIG. 10, the blade aligned along axis 78 is advanced forward relative to the wafer 1 in direction 80 to break street 96, then moved backward relative to the wafer 1 in direction 112 to break street 92, then backward relative to the wafer 1 in direction 112 to break street 90, then forward relative to the wafer 1 in direction 80 to break street 94. A first street (street 96) is broken, then a second street (street 92) is broken, then a third street (street 94) that is between the first and second streets is broken. When the wafer is broken for example at street 92 and at streets 90 and 94, the width of the portion of the wafer on either side of the breaking point is substantially the same.

Any appropriate non-sequential breaking pattern may be used and the invention is not limited to the particular 4-2-1 breaking pattern illustrated in FIG. 10. The same or a different non-sequential breaking pattern may be used to break the wafer from left to right as illustrated in FIG. 9, or a sequential line-by-line breaking pattern may be used to break the wafer from left to right.

In some embodiments, the growth substrate 10, illustrated in FIG. 1, is removed from a wafer of LEDs. If the LEDs are III-nitride LEDs that are typically grown strained, during the substrate removal process, strain is released from the system. The release of strain during substrate removal may result in shifts in the positions of the LEDs as compared to the original coordinates of each LED on the wafer. The LEDs may shift into irregular arrays such that the dicing streets become non-linear and non-parallel to each other. The use of conventional dicing alignment algorithms, which assume the dicing streets are straight and parallel, can reduce yields by cutting in device areas rather than in dicing streets.

In embodiments of the invention, a wafer with location irregularities in the array of LEDs is divided into regions, then a location-specific, best-fit line alignment algorithm is used to determine dicing streets.

Figure 11:
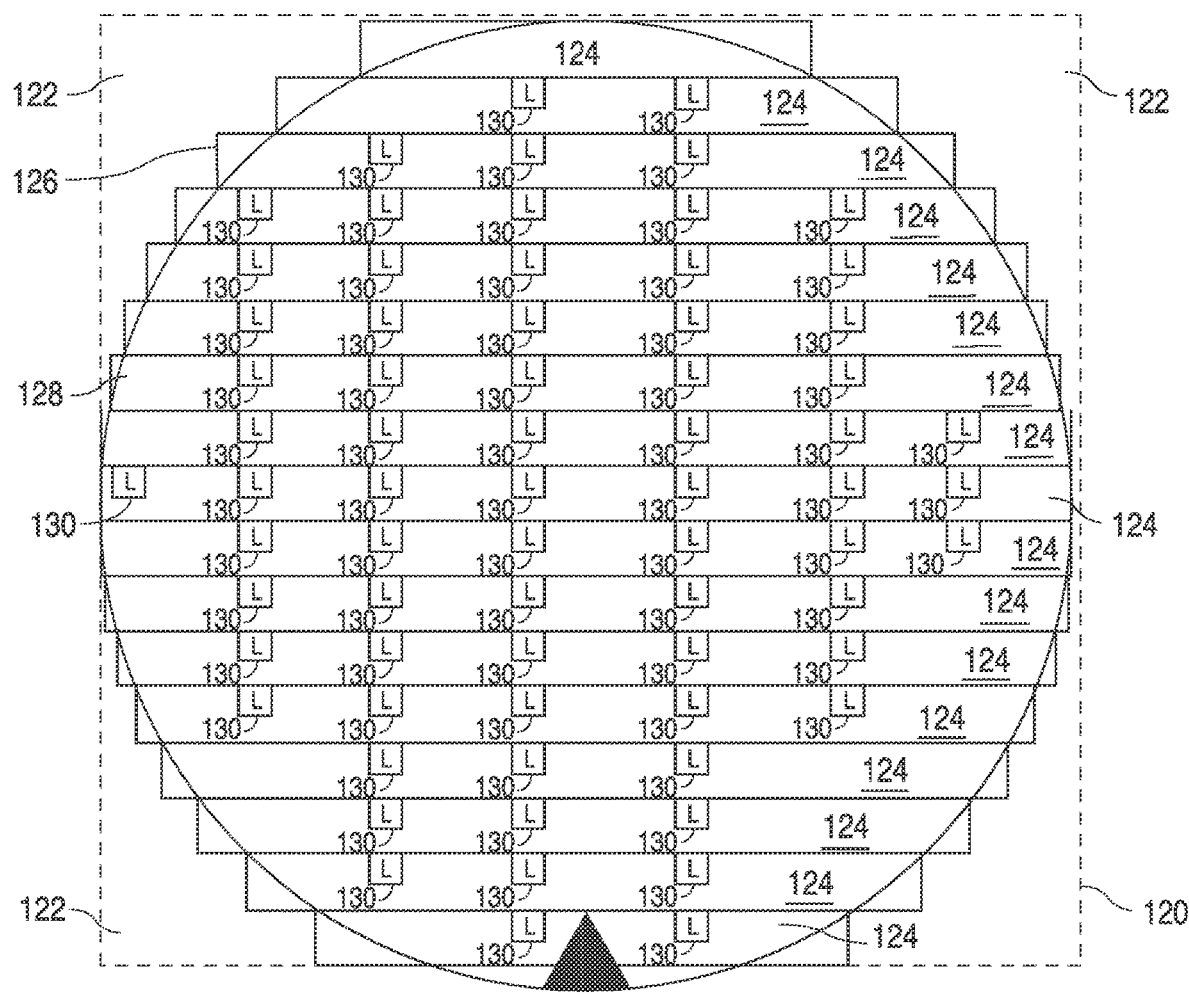
FIG. 11 illustrates dividing a wafer into regions.

FIG. 11 illustrates dividing the wafer 1 into regions 124. Though the wafer 1 illustrated in FIG. 11 is divided into 17 regions, more or fewer regions may be used. For a wafer with n rows of LEDs, each region may include, for example, more than 1 row of LEDs in some embodiments, less than n rows of LEDs in some embodiments, at least 5 rows of LEDs in some embodiments, no more than 50 rows of LEDs in some embodiments, at least 10 rows of LEDs in some embodiments, and no more than 30 rows of LEDs in some embodiments.

In some embodiments, each region includes the number of rows disposed between neighboring fiducials 130. For example, if fiducials 130 are disposed on the wafer every 20 rows of LEDs, each region may include 20 rows of LEDs. (The fiducials 130 illustrated in FIG. 11 are not drawn to scale, as they appear in the figure to occupy half the width of a region, though in reality they would be located on only a single row of a region that might include, for example, more than ten rows.) Location-specific best-fit dicing street alignment is performed in each region illustrated in FIG. 11.

Conventionally, a block-based alignment algorithm, which would treat the wafer as a rectangle 120, is used to check alignment of the dicing streets. The block-based algorithm is inappropriate for a round wafer as processing time is wasted on the nonexistent corners 122, where no devices are located. In embodiments of the invention, the boundaries of all regions add up to substantially the whole wafer to be separated. For example, region 126, which is near the top of the wafer, is narrower than region 128, which is near the center of the wafer. Because the sum of the regions is substantially the same shape as the wafer and not rectangular, no empty area is analyzed or diced, which may reduce the cost of processing the wafer by eliminating wasted process time.

In order to define regions, the user first programs a scribing machine with a rough location of the fiducials 130. The borders of the regions 124 may be user-defined, based on the location of fiducials 130. Fiducials 130 may be right at a border of a region 124 in some embodiments, or at a known, fixed distance from the border of a region in some embodiments. Wafers are loaded into the scribing machine with substantially the same orientation. Accordingly, when a new wafer is loaded, the scribing machine searches for the fiducials at the user-defined locations and searches in a spiral pattern outward until the locations of the fiducials on the particular wafer are found. The wafer-specific fiducial positions are corrected, and alignment begins.

Figure 12:
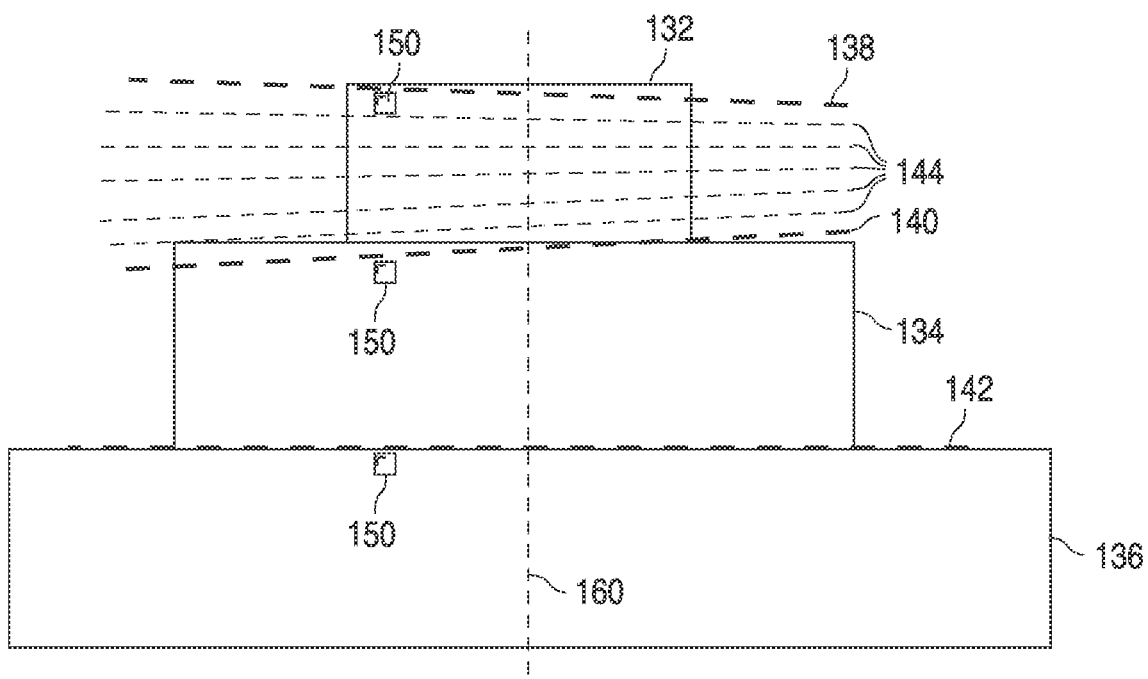
FIG. 12 illustrates determining dicing streets for a region of the wafer illustrated in FIG. 11.

FIG. 12 illustrates using best-fitting lines to determine the appropriate location for dicing streets for an irregular array of LEDs. Dicing street alignment in embodiments of the invention uses a best fit line, rather than only aligning two points within a dicing street, as is conventionally done. Suitable algorithms are commercially available. FIG. 12 illustrates three regions on a wafer, regions 132, 134, and 136. In the embodiment illustrated in FIG. 12, each region includes fiducials 150 at one border of the region (the top of each region in the orientation shown in FIG. 12). In other words, each set of fiducials on the wafer defines the beginning of a new region. In some embodiments, fiducials are located within a region, not at the borders of a region.

During alignment, the scribing machine identifies a best-fit line 138 using fiducial positions along line 138 at the top border of region 132. Then, the scribing machine identifies a best-fit line 140 using fiducial positions along line 140 at the top border of region 134. The process is repeated for line 142 and for all the remaining fiducial positions on the wafer. Algorithms to determine the best-fit line are commercially available. For examples, the best-fit lines can be identified using Least Square fits, using 2 fiducials or more per line.

The location of scribe lines 144 between two best-fit lines is determined by interpolating between the best-fit lines. In particular, in order to identify the location of scribe lines 144 between two adjacent best fit lines 138 and 140 in region 132, the distance between the Y-intercepts of lines 138 and 140 at least one location (such as, for example, Y-axis 160, which is perpendicular to the scribe lines being fit) is divided by the number of rows of LEDs disposed between lines 138 and 140, to determine the distance between each of the Y-intercepts of lines 144. The location of the Y-intercept of the first scribe line 144 above line 140 is determined by adding the calculated distance to the Y-intercept of line 140; the location of the Y-intercept of the second scribe line 144 above line 140 is determined by adding the calculated distance to the Y-intercept of the first scribe line 144 above line 140, and so on for each of scribe lines 144.

The slope adjustment of each scribe line 140 may be similarly determined by dividing the difference between the slopes of lines 138 and 140 by the number of rows of LEDs disposed between lines 138 and 140, then adding the calculated slope adjustment to the slope of line 140 to determine the slope of the first scribe line 144 above line 140, and so on.

The process is repeated for region 134 using Y-intercepts and slopes of best-fit lines 140 and 142, and so on for each successive region.

After the best-fit location of the streets is determined, the wafer may be cut along the streets by any suitable technique including, for example, cutting with the saw blade or a laser, or scribing and breaking.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A method of separating a wafer comprising a plurality of rows of light emitting devices, the method comprising:
    dividing the wafer into a plurality of regions, each of the plurality of regions including at least one of the plurality of rows of light emitting devices and one or more features each having a known location in the wafer;
    using the known location of the one or more features to identify a best-fit line defining a border between each of the plurality of regions;
    interpolating between adjacent best-fit lines to identify locations for the first dicing streets within each of the plurality of regions by dividing a distance between Y-intercepts of the adjacent best-fit lines by a number of rows of LEDs between the adjacent best-fit lines to determine a distance between Y-intercepts of each of the dicing streets;
    determining a slope adjustment of each of the plurality of dicing streets by dividing a difference between slopes ofthe adjacent best-fit lines by the number of light emitting devices disposed between the adjacent best-fit lines
    providing the plurality of dicing streets on the wafer such that a respective dicing street of the plurality of dicing streets is provided between each of the plurality of rows of light emitting devices on the wafer;
    breaking the wafer along a first one of the plurality of dicing streets to separate a first portion of the wafer from a remaining portion of the wafer, the first portion of the wafer comprising more than one of the plurality of rows of light emitting devices; and breaking the first portion of the wafer along a second one of the plurality of dicing streets to separate a second portion of the wafer from the first portion of the wafer.

2. The method of claim 1, further comprising breaking the second portion of the wafer along a third one of the plurality of first dicing streets to separate a third portion of the wafer from the second portion of the wafer.

3. The method of claim 2, wherein the first portion of the wafer comprises four rows of light emitting devices, the second portion of the wafer comprises two rows of light emitting devices, and the third portion of the wafer comprises a single row of light emitting devices.

4. The method of claim 1, further comprising, prior to breaking the wafer along the first and second ones of the plurality of first dicing streets, placing a first surface of the wafer on a dicing frame and placing a wafer cover over a second surface of the wafer opposite the first surface.

5. The method of claim 4, wherein the breaking the wafer along the first and second ones of the plurality of first dicing streets comprises applying a force to a blade placed on the dicing frame along the first and second ones of the plurality of first dicing streets, respectively.

6. The method of claim 1, wherein at least two of the plurality of regions have different sizes.

7. The method of claim 1, wherein the best-fit line is identified using a Least Square fits algorithm using two or more features per best-fit line.

8. The method of claim 1, further comprising:
    separating the wafer into individual light emitting devices by sequentially or non-sequentially breaking at least one of the first portion, the second portion and the remaining portion of the wafer along respective second dicing streets between the plurality of columns of the light emitting devices.

9. The method of claim 1, further comprising scribing grooves along each of the plurality of first dicing streets prior to breaking the wafer.

10. The method of claim 9, wherein the wafer has a substrate having a thickness greater than 200 microns, at least one of the plurality of dicing streets is a kerf detection and correction street, and the scribing the grooves comprises:
    scribing singulation grooves sequentially along the plurality of first dicing streets until a kerf detection and correction street is reached,
    scribing a pilot groove along the kerf detection and correction street,
    checking kerf position of the wafer using at least one feature having a known location in the wafer and, on a condition that adjustment of the wafer is needed based on the checked kerf position of the wafer, moving the wafer to realign the wafer according to a pre-determined distance between the at least one feature, and
    scribing a singulation groove over the pilot groove after the wafer is realigned, the singulation groove destroying the pilot groove.

11. The method of claim 10, wherein the singulation groove is deeper and wider than the pilot groove.

12. The method of claim 10, wherein the pilot groove is scribed using a laser scribe at a lower process power than is used for scribing the singulation grooves.

13. The method of claim 10, wherein a depth of the pilot groove is no more than 30% of a depth of the singulation grooves.

14. The method of claim 10, wherein a width of the pilot groove is not more than 70% of a width of the singulation grooves.

15. A method of separating a wafer comprising a plurality of rows of light emitting devices, the method comprising:
    providing a wafer comprising a substrate that has a thickness greater than 200 microns;
    providing a plurality of dicing streets, including at least one kerf detection and correction street, on the wafer such that a respective dicing street of the plurality of dicing streets is provided between each of the plurality of rows of light emitting devices on the wafer;
    scribing singulation grooves sequentially along the plurality of dicing streets until the kerf detection and correction street is reached;
    scribing a pilot groove along the kerf detection and correction street;
    checking kerf position of the wafer using at least one feature having a known location in the wafer and, on a condition that adjustment of the wafer is needed based on the checked kerf position of the wafer, moving the wafer to realign the wafer according to a pre-determined distance between the at least one feature;

scribing a singulation groove over the pilot groove after the wafer is realigned, the singulation groove destroying the pilot groove;

breaking the wafer along a first one of the plurality of dividing streets to separate a first portion of the wafer from a remaining portion of the wafer, the first portion of the wafer comprising more than one of the plurality of rows of light emitting devices; and breaking the first portion of the wafer along a second one of the plurality of dicing streets to separate a second portion of the wafer from the first portion of the wafer.

\* \* \* \* \*